United States Patent

Freund et al.

[11] Patent Number: 6,109,861
[45] Date of Patent: Aug. 29, 2000

[54] APPARATUS AND METHOD FOR ROTATING SEMICONDUCTOR OBJECTS

[75] Inventors: Joseph Michael Freund, Fogelsville; Raymond Frank Gruszka, Reading; George John Przybylek, Douglasville; Dennis Mark Romero, Allentown, all of Pa.

[73] Assignee: Lucent Technologies, Inc., Murray Hill, N.J.

[21] Appl. No.: 09/135,186

[22] Filed: Aug. 17, 1998

[51] Int. Cl.[7] .................................................. B65G 47/24
[52] U.S. Cl. ............................................ 414/755; 414/816
[58] Field of Search .......................... 198/380; 414/755, 414/816

[56] References Cited

U.S. PATENT DOCUMENTS 4,960,360  10/1990  Giannuzzi et al. ................... 414/755
5,044,872   9/1991  Hunt et al. ........................ 414/755 X Primary Examiner—Janice L. Krizek

[57] ABSTRACT

A device and method for the automated rotating of semiconductor objects during the fabrication process is disclosed. The device uses a slotted base fixture with a channel, lifting members with ducts, and a vacuum. Semiconductor objects are rotated from a vertical position to a substantially horizontal essentially evenly spaced parallel configuration. The positioning of the semiconductor objects by the device is such that the facet end of each semiconductor object remains undisturbed. The configuration of the semiconductor objects allows for quick and easy transfer to a storage surface or transfer to further semiconductor processing steps.

16 Claims, 6 Drawing Sheets

6,109,861

APPARATUS AND METHOD FOR ROTATING SEMICONDUCTOR OBJECTS

FIELD OF THE INVENTION

This invention relates generally to apparatus for rotating semiconductor objects and specifically to an apparatus which rotates and positions semiconductor objects without disturbing the facet ends of the semiconductor objects.

BACKGROUND OF THE INVENTION

Semiconductor fabrication processes involve fabricating several thousand individual devices on one wafer. Specifically, semiconductor wafers are cleaved to form chips, die, pieces and bars, which are later used in electronics and computer devices. After cleaving, the semiconductor chips are coated and are ready for further processing or storage. Due to the small size and delicate nature of the semiconductor chips, particularly careful handling is required to prevent damage such as chipping or breaking. Furthermore, it is essential that the orientation of coated semiconductor chips on the storage or processing surface is completed without touching the facet end of the semiconductor chips.

Currently, orienting semiconductor chips on a surface for processing or storage is done manually by an operator using a vacuum pick. The operator uses the vacuum pick to transfer coated semiconductor chips, one at a time, from coating blade fixtures to a vinyl surface or other storage or processing surface. When manually rotating the semiconductor chips, the operator has to be extremely careful that the facet end of the chips does not get touched during the transfer to prevent chip contamination or breakage. The operator must configure the semiconductor chips on the storage surface so that each semiconductor chip is substantially parallel to the other. The angle between each of the semiconductor chips on the surface can be no more than 5 degrees off of parallel.

The manual handling of the semiconductor objects is extremely time consuming, especially when the alignment of the chips on the storage or processing surface must be corrected. An operator must be trained in handling and aligning the semiconductor chips so that the facet end of the semiconductor object is never touched to prevent damage or contamination. Even after an operator has been carefully trained in the manual handling of the semiconductor chips, there are still numerous instances of breakage and damage.

SUMMARY OF THE INVENTION

The invention is an automated device and method for unloading one or a batch of semiconductor objects from a vertical position compressed between coating fixture blades to a horizontal position on a surface for processing or storage. When more than one semiconductor object is unloaded, the batch of semiconductor objects must be oriented on the storage surface in an essentially evenly spaced parallel configuration. The invention uses a slotted base fixture, lifting members and a vacuum to perform this task.

The preferred embodiment of the invention comprises a base fixture having slots in which lifting members sit. The base fixture has a channel running substantially horizontally along the length of the bottom of the base fixture. The lifting members have a substantially vertical duct. The channel in the base fixture and the ducts in the lifting members form a contiguous passageway to accommodate a vacuum air flow. Side plates are located adjacent along the length of the front and back ends of the base fixture.

The compression of the coating blade fixtures is released and the lifting members and side plates are simultaneously lifted by a cam. The vacuum is then applied causing the semiconductor objects to fall and rotate 90 degrees so that they are oriented in a substantially horizontal essentially evenly spaced parallel configuration on the level surface of the base fixture. The semiconductor objects are then ready for further processing or storage.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE DRAWINGS

For clarity of expression, a general overview of the invention is first given. An exemplary embodiment is then given followed by an operational explanation of the invention.

Generally, the invention is a device and method for rotating small scale objects ranging in dimensions from about 300 to 10,000 microns. The objects, for example, can be semiconductor wafers, wafer sections, bars lasers, chips and other such practical devices. The invention rotates one or more objects from a substantially vertical position to a substantially horizontal position and in particular, the apparatus and method rotate the objects 90°. Each object originates in a vertical position compressed between two structures. The invention rotates the objects 90° to a horizontal position so that the objects are configured for quick and easy transfer to a flat surface for storage or further processing. Most importantly, the rotation of the objects from a vertical to a horizontal position occurs without any contact to one end of the objects.

The invention has numerous embodiments which rotate a varying number of objects. That is, depending on the number of slots in the base fixture, the invention has the ability to rotate up to as many objects as there are slots. When a plurality of objects is rotated, the invention orients the batch of objects in an essentially evenly spaced parallel configuration.

The device comprises a slotted base fixture with a channel running substantially horizontally along the bottom. Lifting members each having a substantially vertical duct sit in the slots and translate up from the slotted base fixture and down, returning to their original position. The disclosed embodiment uses a cam to translate the lifting members. The number of slots in the base fixture and the number of lifting members determine how many objects the invention can rotate at one time.

The lifting members properly position the objects in an essentially evenly spaced parallel configuration. The lifting members have a variety of shapes such as rectangular, square or T-shaped. The disclosed embodiment of the invention uses T-shaped lifting members. A vacuum is applied through the channels and ducts to rotate the objects.

Referring now to FIGS. 1–5, an exemplary embodiment of the invention and its components are illustrated.

Figure 1:
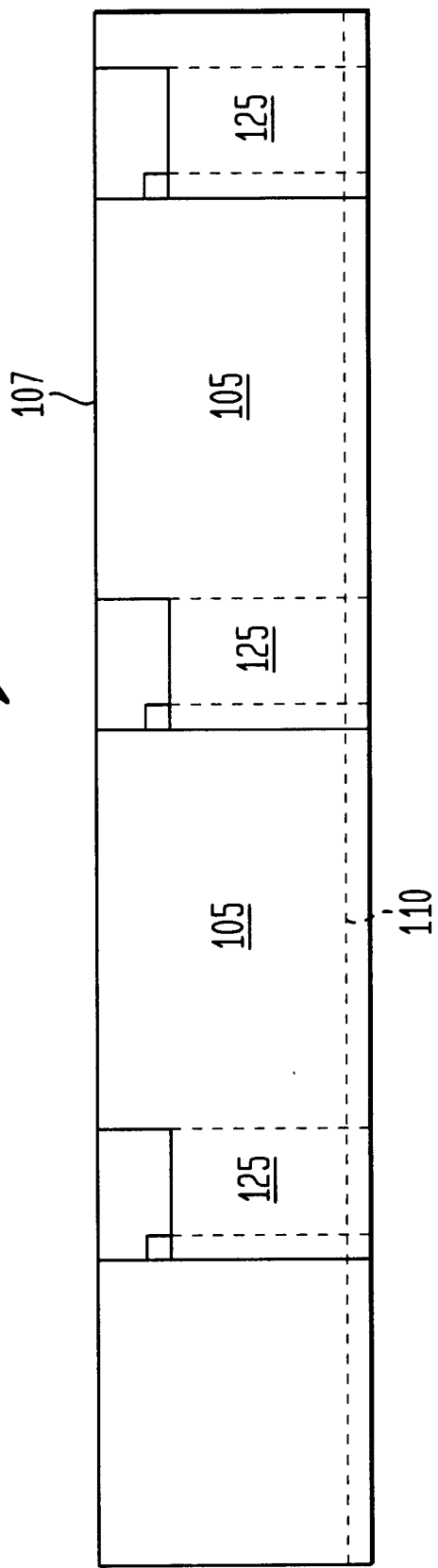
FIG. 1 is a cross sectional side view of a device for rotating semiconductor objects.
Figure 4:
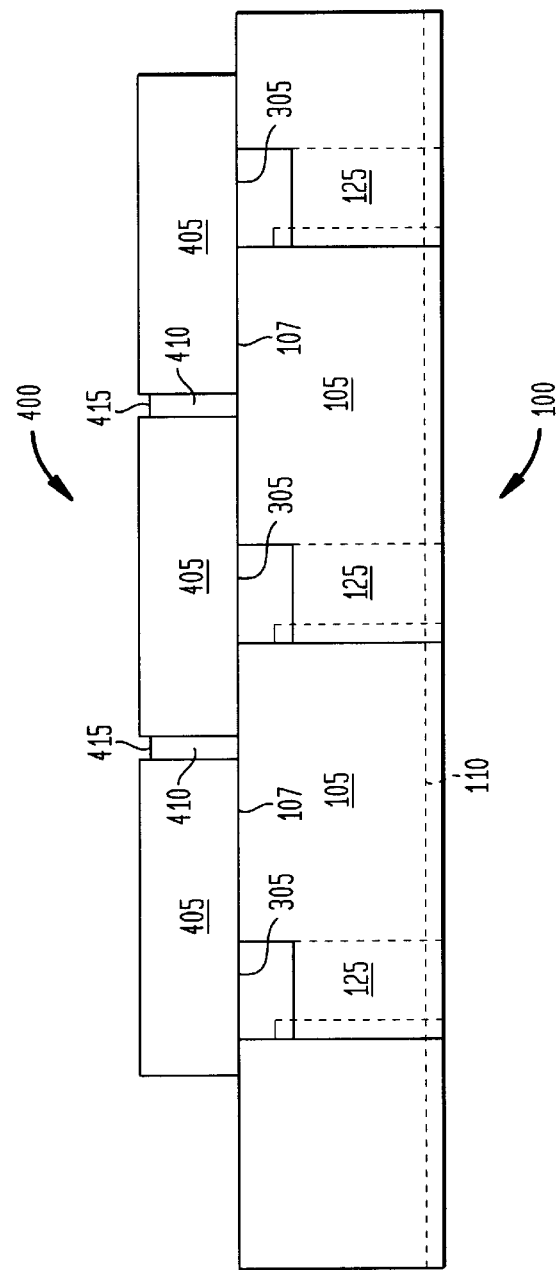
FIG. 4 is a cross sectional side view of a device for rotating semiconductor objects in the ready position.
Figure 5:
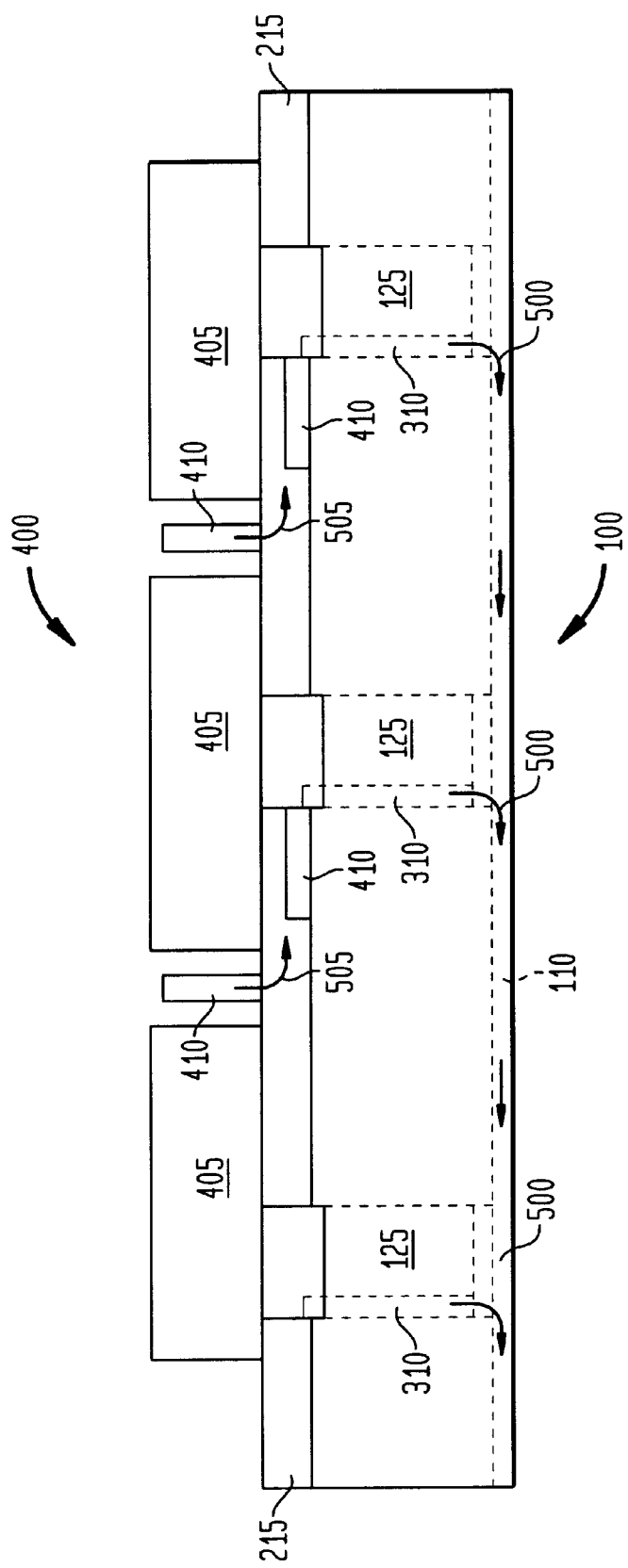
FIG. 5 is a cross sectional side view of a device for rotating semiconductor objects in the open position.
Figure 6:
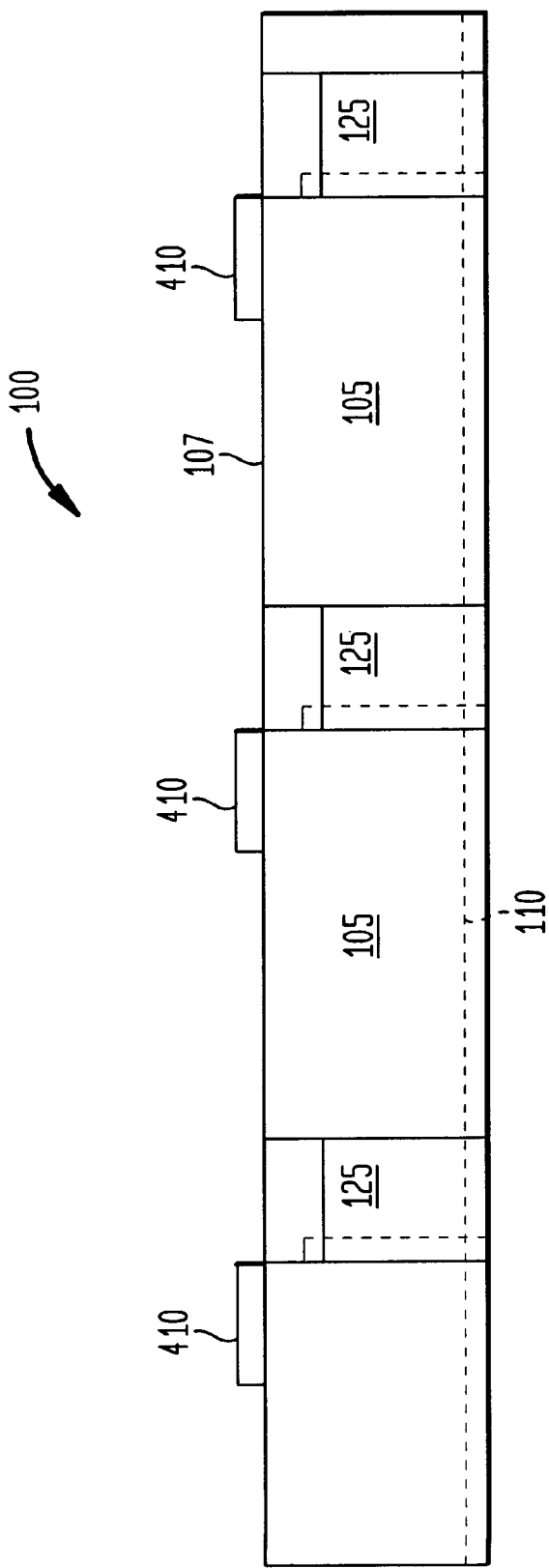
FIG. 6 is a cross sectional side view of a device for rotating semiconductor objects in the final position.

FIG. 1 shows a device 100 for handling small scale objects, such as semiconductor objects 410 (shown in FIGS. 4–6). The device 100 rotates semiconductor objects 410 from a vertical position to a horizontal position. The device 100 has a base fixture 105 having a plurality of slots and an upper surface 107. The base fixture 105 further defines a vacuum channel 110 located substantially horizontally along the bottom of the base fixture 105. Side plates 215 (shown in FIG. 2) run along the length of a front and back of the base fixture 105. Lifting members 125 sit in each of the slots 200 (shown in FIG. 2) along the length of the base fixture 105.

Figure 2:
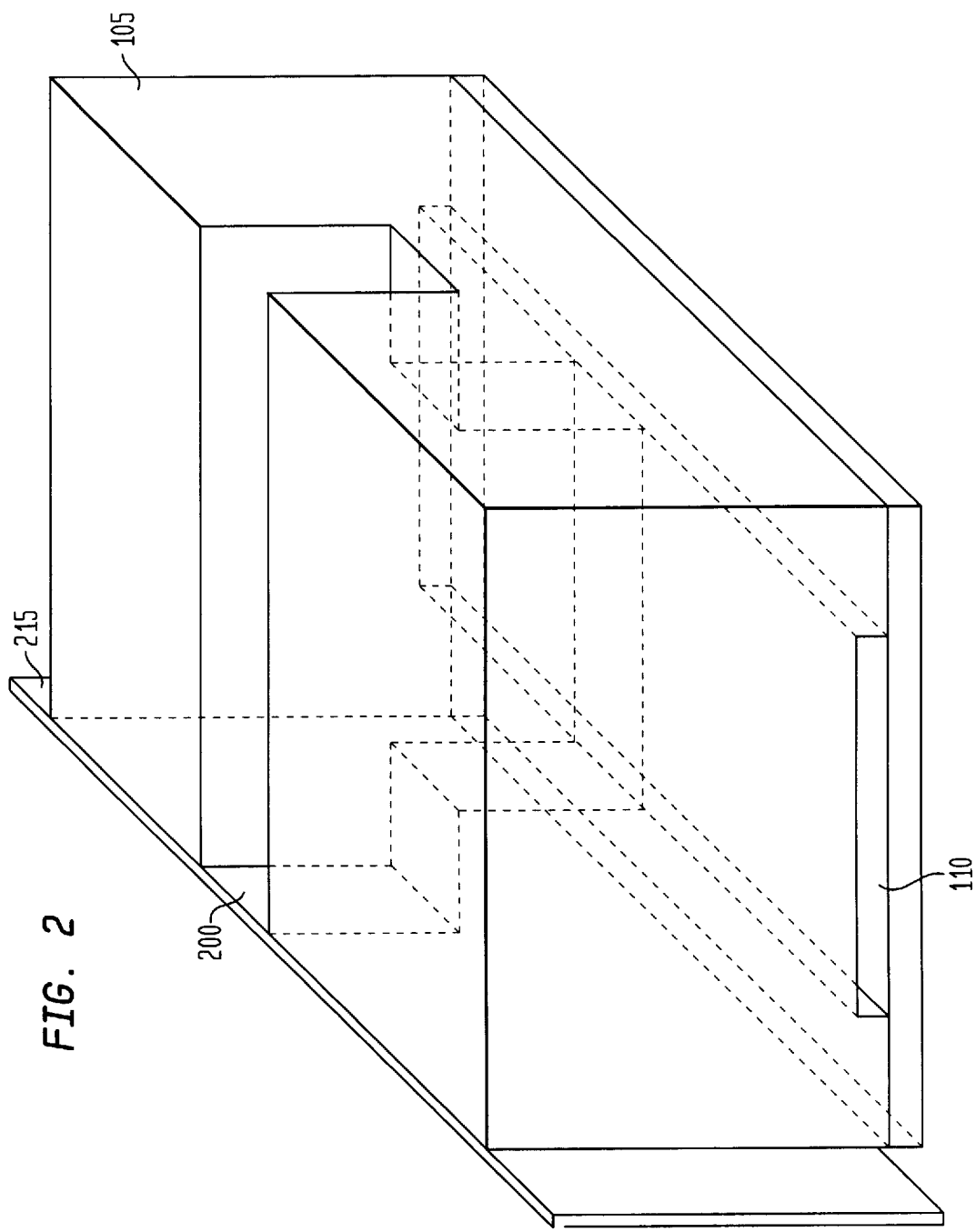
FIG. 2 is an isometric view of a section of the base fixture with a side plate.

Referring now to FIG. 2, an isometric view of a section of the base fixture 105 is shown, that section having a slot 200. FIG. 2 shows the section of the base fixture 105 alone, as no lifting member is depicted. The base fixture 105 is further illustrated showing vacuum channel 110 running substantially horizontally along the length of the bottom of the base fixture 105. One of the side plates 215 is further illustrated in the ready position.

Figure 3:
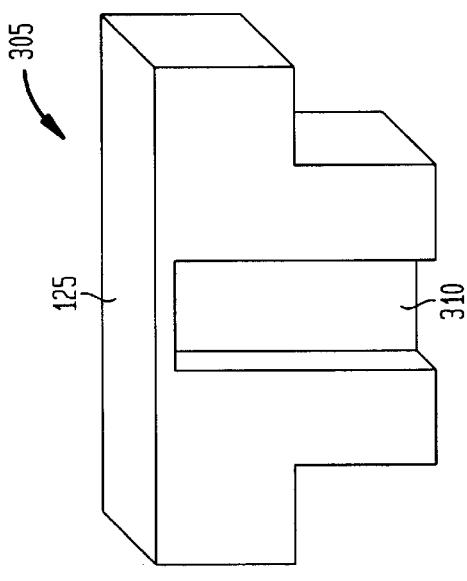
FIG. 3 is an isometric view of a lifting member.

FIG. 3 depicts a lifting member 125. The lifting member 125 can be a variety of shapes. In this embodiment, T-shaped lifting members are used. The lifting member 125 has a top surface 305 and a vacuum duct 310.

FIG. 4 shows the device 100 in the ready position. A work fixture 400 having structures or coating blades 405 is depicted. The work fixture 400 sits on a level surface formed by the top surface 305 of the lifting members 125 and the upper surface 107 of the base fixture 105 when the device 100 is in the ready position.

A sliding mechanism (not shown) is built into the work fixture 400. The sliding mechanism compresses the coating blades 405 together to hold a semiconductor object 410 in a vertical position between each coating blade 405. A facet end 415 of the semiconductor object 410 must remain undisturbed and untouched. The coating blades 405 apply coating to each side of each semiconductor object 410 while the semiconductor object 410 is vertically positioned between the coating blades 405.

After the coating blades 405 have coated the semiconductor objects 410, a mechanism such as a mechanical arm (not shown) places the work fixture 400 on the level surface of the device 100 while the device 100 is in the ready position. Referring to FIG. 4, the mechanism positions the work fixture 400 on the device 100 such that each coating blade 405 rests on a corresponding lifting member 125.

FIG. 5 shows the device 100 and the work fixture 400 in the open position. Operationally, the compression of the coating blades 405 is released and the lifting members 125 and side plates 215 are simultaneously raised by a cam (not shown). When the lifting members 125 are raised or in the open position, the ducts 310 and the channel 110 form a contiguous passageway. A vacuum air flow is applied through the passageway as shown by arrow 500. The side plates 215 raise with the lifting members 125 to contain the vacuum air flow so that the direction of such flow is from the top of the base fixture 105 through the ducts 3 310 and out the channel 110 as depicted by arrows 500. The vacuum rotates the semiconductor objects 410 as shown by arrow 505. Each semiconductor object 410 is stopped in its proper position on the upper surface 107 of the base fixture 105 by a corresponding lifting member 125. FIG. 5 shows semiconductor object 410 in a horizontal position and flush against its respective lifting member 125. The raised lifting members 125 ensure that the bars are essentially evenly spaced and substantially parallel by serving as stoppers.

FIG. 6 shows the semiconductor objects 410 in the proper position on the upper surface 107 of the base fixture 105. The work fixture 400 has been vertically removed off of the base fixture 105 by mechanism such as a mechanical arm (not shown). The lifting members 125 retract back to their original position in the slots 200 of the base fixture 105. The semiconductor objects 410 are now ready to be transferred to a storage surface or onto further processing steps. A storage surface (not shown) can now be lowered on top of the semiconductor objects 410 positioned on the level surface of the device 100. The storage surface, arranged to cause objects to be stored to adhere to that surface upon contact between the two, will lift the semiconductor objects 410 off of the base fixture 105. The device is now ready for the process to begin again. Most importantly, throughout the process, the facet ends 415 of the semiconductor objects 410 have remained undisturbed.

Figure 7:
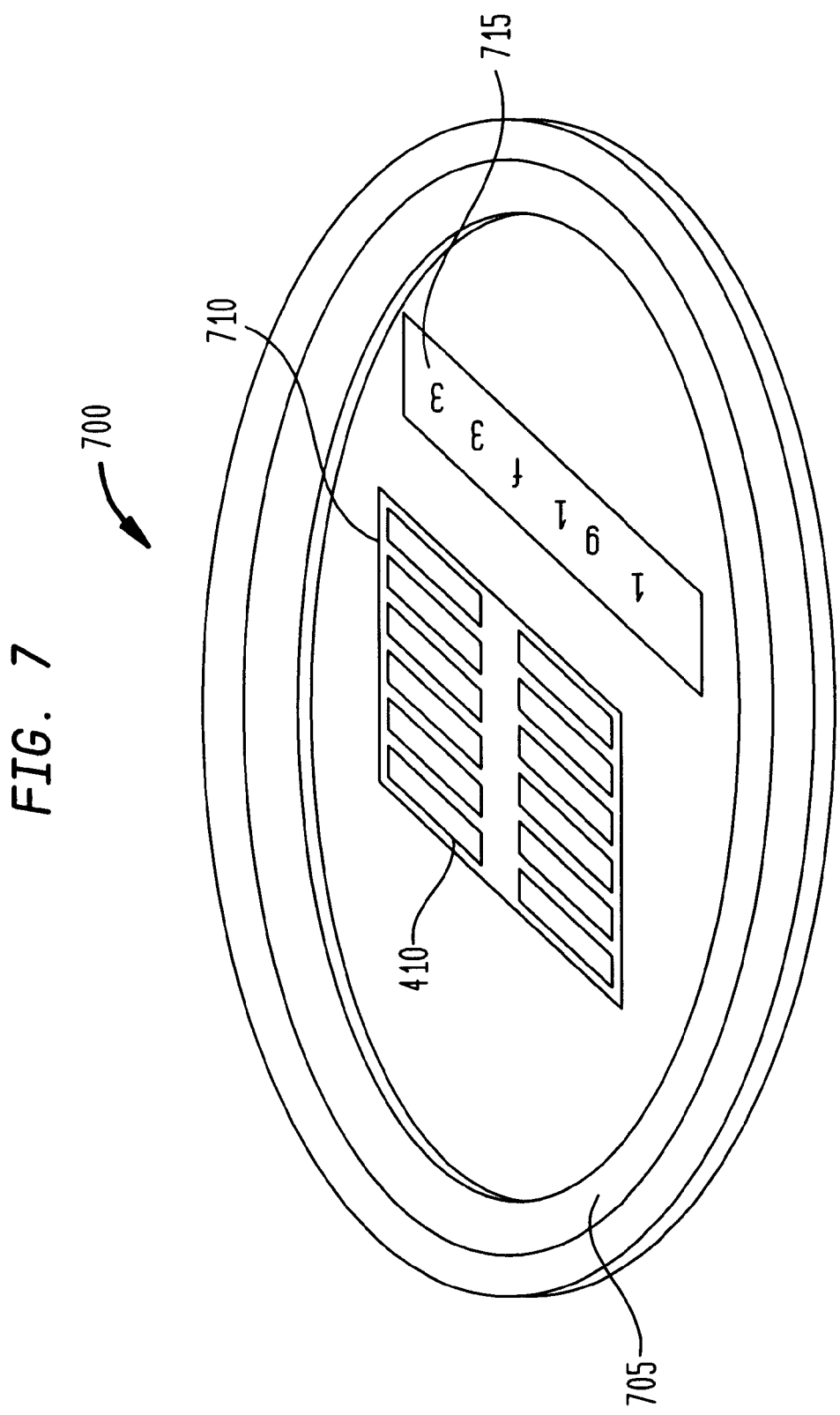
FIG. 7 is an isometric view of a storage surface loaded with semiconductor objects.

An exemplary embodiment of the storage surface which may be used to store the semiconductor objects after they have been rotated is disclosed in concurrently filed U.S. patent application Ser. No. 09/135,420 entitled "Apparatus and Method for Storing Semiconductor Objects," having common inventors and a common assignee, herein incorporated by reference. Referring to FIG. 7, storage surface 700 has a mounting structure 705, temperature sensitive adherent film (not shown), a spacer (not shown) and a mylar cover sheet 710. FIG. 7 further shows semiconductor objects 410 adhered to the storage surface 700 in substantially horizontal essentially evenly spaced parallel configuration. A label 715 allows for easy identification of the semiconductor objects 410.

While the invention has been described with reference to preferred embodiments, it should be appreciated by those skilled in the art that the invention may be practiced otherwise than as specifically described herein without departing from the scope of the invention. It is, therefore to be understood that the scope of the invention be limited only by the appended claims.

What is claimed:

1. A device for rotating at least one semiconductor object from a vertical position compressed between at least two structures to a substantially horizontal position, said device comprising:

a base fixture, said base fixture having at least one slot and a channel running substantially horizontally along a bottom of said base fixture;

a lifting member corresponding to each said at least one slot, each said lifting member having a substantially vertical duct, each said lifting member positioned in a corresponding slot;

two side plates, one side plate adjacent to the length of the front end of said base fixture and a remaining side plate adjacent to the length of the back end of said base fixture; and a means for vertically translating said lifting members and said two side plates simultaneously;

wherein each said lifting member and said two side plates raise said structures after compression of said structures is released, a vacuum air flow being applied through said channel and said substantially vertical ducts for translating and rotating said at least one semiconductor object to a substantially horizontal position on said base fixture, where non-faceted ends of each said at least one semiconductor object is positioned flush against a corresponding lifting member.

2. The device of claim 1, wherein said means for vertically translating said lifting members said two side plates is a cam.

3. The device of claim 1, wherein said ducts and said channel form a contiguous passageway for said vacuum air flow when each said lifting member is raised.

4. The device of claim 1, wherein said semiconductor objects are positioned on said base fixture in a substantially horizontal essentially evenly spaced parallel configuration.

5. The device of claim 1 wherein said semiconductor objects have a facet end which remains undisturbed.

6. The device of claim 1 wherein each said lifting member has a flat upper surface.

7. The device of claim 1 wherein each said lifting member is a T-shaped structure and each said at least one slot is T-shaped.

8. A device for positioning semiconductor objects comprising:

a slotted base fixture having slots and a channel running substantially horizontally along a bottom of said base fixture;

a lifting member positioned in each slot of said slotted base fixture, each said lifting member having a substantially vertical duct;

two side plates, one side plate adjacent to the length of a front end of said base fixture and the remaining side plate adjacent to the length a back end of said base fixture; and a cam for simultaneously vertically translating each said lifting member and said two side plates;

wherein after structures holding semiconductor objects in compression release, a vacuum air flow is applied through said channel and said substantially vertical ducts for translating and rotating said semiconductor objects to a substantially horizontal position on said base fixture, where a non-facet end of each said semiconductor object is positioned flush against a corresponding lifting member in an essentially evenly spaced parallel configuration and each said lifting member and said two side plates return to an original position.

9. The device of claim 8, wherein each said substantially vertical duct and said channel form a contiguous passageway for said vacuum air flow when each said lifting member is raised.

10. The device of claim 8, wherein said semiconductor objects are positioned on said base fixture in a substantially horizontal essentially evenly spaced parallel configuration.

11. The device of claim 8, wherein each said semiconductor object has a facet end which is not touched during the rotating of said semiconductor object.

12. A method for rotating at least one semiconductor object from a vertical position to a substantially horizontal essentially evenly spaced parallel configuration without touching a facet end of a semiconductor object, said method comprising the steps of:

releasing said at least one semiconductor object from a substantially vertical position;

simultaneously raising lifting members having substantially vertical ducts and two side plates from a base fixture; and applying a vacuum air flow through a channel running horizontally along the bottom of said base fixture and said ducts for translating and rotating said at least one semiconductor object from said vertical position to a substantially horizontal position on said base fixture, a non-facet end of said at least one semiconductor object being flush against a corresponding lifting member while said lifting members are raised.

13. The method of claim 12 further comprising the step of lowering said lifting members to an original position in said base fixture.

14. The method of claim 12, wherein during the step of raising said lifting members, a passageway is formed by each substantially vertical duct and said channel.

15. The method of claim 12, wherein said at least one semiconductor object is positioned on said base fixture in a substantially horizontal essentially evenly spaced parallel configuration.

16. The method of claim 12, wherein a facet end of said at least one semiconductor object remains undisturbed.

* * * * *